(12) United States Patent
Grötsch et al.

(10) Patent No.: US 11,187,392 B2
(45) Date of Patent: Nov. 30, 2021

(54) HEADLIGHT AND OPERATING METHOD

(71) Applicant: OSRAM OLED GmbH, Regensburg (DE)

(72) Inventors: Stefan Grötsch, Bad Abbach (DE); Joachim Reill, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/755,058

(22) PCT Filed: Nov. 16, 2018

(86) PCT No.: PCT/EP2018/081594
§ 371 (c)(1),
(2) Date: Apr. 9, 2020

(87) PCT Pub. No.: WO2019/105769
PCT Pub. Date: Jun. 6, 2019

(65) Prior Publication Data
US 2021/0190282 A1    Jun. 24, 2021

(30) Foreign Application Priority Data

Nov. 28, 2017 (DE) .................. 10 2017 128 125.8

(51) Int. Cl.
*F21S 41/143*  (2018.01)
*F21S 41/153*  (2018.01)
(Continued)

(52) U.S. Cl.
CPC ............. *F21S 41/143* (2018.01); *B60Q 1/14* (2013.01); *F21S 41/147* (2018.01);
(Continued)

(58) Field of Classification Search
CPC ... H01L 27/156; H01L 33/0025; H01L 33/08; H01L 33/20; H01L 33/30; H01L 33/305;
(Continued)

(56) References Cited

U.S. PATENT DOCUMENTS

2006/0239024 A1    10/2006    Valcamp et al.
2008/0062712 A1    3/2008     Woodward
(Continued)

FOREIGN PATENT DOCUMENTS

CN    101023298 A    8/2007
CN    101132950 A    2/2008
(Continued)

OTHER PUBLICATIONS

Office Action issued for corresponding Japanese Patent Application No. 2020-528083 dated Mar. 23, 2021, along with an English translation.

(Continued)

*Primary Examiner* — Erin Kryukova
(74) *Attorney, Agent, or Firm* — Hauptman Ham, LLP

(57) ABSTRACT

A headlamp includes a first semiconductor chip and a second semiconductor chip for generating light. The first and second semiconductor chips each include several pixels. A first optics is arranged to direct light from the first semiconductor chip with a first magnification into a base region. Via a second optics, light of the second semiconductor chip is directed into a bright region with a second magnification. The second magnification is between 0.3 times and 0.7 times the first magnification inclusive, so that the bright region is smaller than the base region. The bright region is within the base region.

16 Claims, 5 Drawing Sheets

Figure 1A:
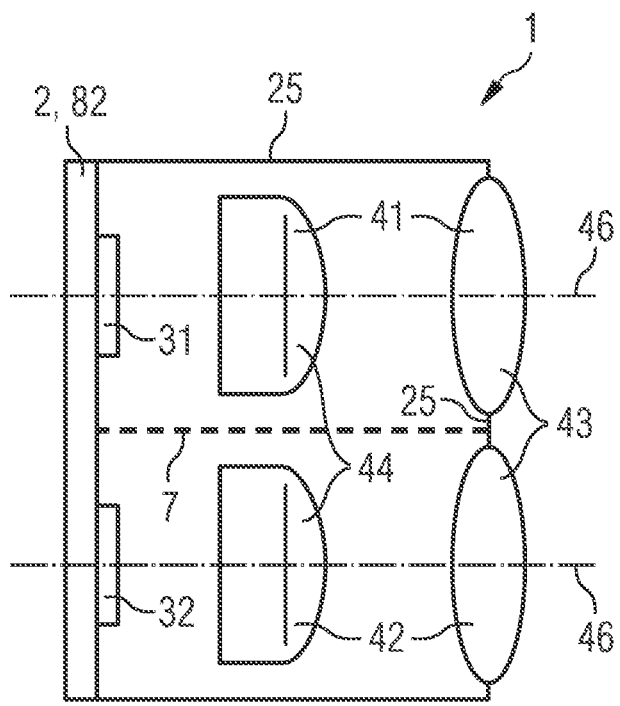

(51) Int. Cl.
*H01L 27/15* (2006.01)
*F21S 41/255* (2018.01)
*F21S 41/147* (2018.01)
*F21S 41/663* (2018.01)
*B60Q 1/14* (2006.01)
*F21Y 115/10* (2016.01)

(52) U.S. Cl.
CPC ........... *F21S 41/153* (2018.01); *F21S 41/255* (2018.01); *F21S 41/663* (2018.01); *H01L 27/156* (2013.01); *F21Y 2115/10* (2016.08)

(58) Field of Classification Search
CPC ........ H01L 33/50; H01L 33/58; F21S 41/143; F21S 41/255; F21S 41/25; F21S 41/663; F21S 41/153; F21S 41/151; F21S 41/155; B60Q 1/14; F21Y 2115/10
See application file for complete search history.

(56) References Cited

U.S. PATENT DOCUMENTS

| | | | |
|---|---|---|---|
| 2009/0034278 A1* | 2/2009 | Tessnow | F21S 41/143 362/511 |
| 2011/0235349 A1* | 9/2011 | Nakaya | F21S 41/151 362/466 |
| 2015/0219298 A1* | 8/2015 | Mollers | F21S 41/19 362/520 |
| 2017/0241606 A1 | 8/2017 | Courcier et al. | |
| 2019/0259738 A1* | 8/2019 | Haiberger | H01L 23/3114 |

FOREIGN PATENT DOCUMENTS

| | | |
|---|---|---|
| CN | 106989342 A | 7/2017 |
| DE | 102005041234 A1 | 3/2007 |
| DE | 102007052745 A1 | 5/2009 |
| DE | 102008039092 A1 | 2/2010 |
| DE | 102013114264 A1 | 7/2015 |
| DE | 102016100351 A1 | 7/2017 |
| EP | 3 095 710 A1 | 11/2016 |
| EP | 3208530 A1 | 8/2017 |
| JP | 2008-513967 A | 5/2008 |
| JP | 2008-537315 A | 9/2008 |
| JP | 2011-201400 A | 10/2011 |
| KR | 10-2017-0098714 A | 8/2017 |
| WO | 2017/042943 A1 | 3/2017 |

OTHER PUBLICATIONS

International Search Report issued for corresponding International Patent Application No. PCT/EP2018/081594, along with an English translation, citing above references.
Written Opinion issued for corresponding International Patent Application No. PCT/EP2018/081594, citing above references.
Brunne D. et al., "Outlook on high resolution pixel light", Proceeding of the 12th International Symposium on Automotive Lighting; ISAL 2017, München; Herbert Utz Verl., 2017 (Darmstädter Lichttechnik, vol. 17), pp. 243-251, No. 6.
Gut C. et al., "Digital Light—Experiences with the development of high resolution headlights at Daimler", Proceedings of the 12th International Symposium on Automotive Lighting; ISAL 2017, München; Herbert Ultz Verl., 2017 (Darmstädter Lichttechnik, vol. 17), pp. 253-261, No. 6.
Trommer J. et al., "New Possibilities with μAFS modules—The Path to High-Resolution Full-Matrix Headlamps", Proceedings of the 12th International Symposium on Automotive Lighting; ISAL 2017, München; Herbert Ultz Verl., 2017 (Darmstädter Lichttechnik, vol. 17), pp. 333-341, No. 6.
Search Report issued for corresponding German Patent Application No. 10 2017 128 125.8 dated May 16, 2018, citing above references.
Böke B. et al.; "The Mercedes-Benz Headlamp of the Future: Higher Resolution with Greater Intelligence for Enhanced Safety", In 11th International Symposium on Automotive Ligthing, Darmstadt; 2015; Abstract.
Takahashi Y. et al.; "Development of 288 Segments Matrix Adb System with Improved both Visibility and Safety", Stanley Electric Co.; International Symposium on Automotive Lighting; ISAL 2017; Abstract.
Office Action issed for corresponding Chinese Patent Application No. 201880068072.6 dated Aug. 4, 2021, along with an English translation.
Decision to Grant a Patent issued for corresponding Japanese Patent Application No. 2020-528083 dated Aug. 31, 2021, along with an English translation.
Office Action issued for corresponding Korean Patent Application No. 10-2020-7018494 dated Sep. 23, 2021, along with an English translation.

* cited by examiner

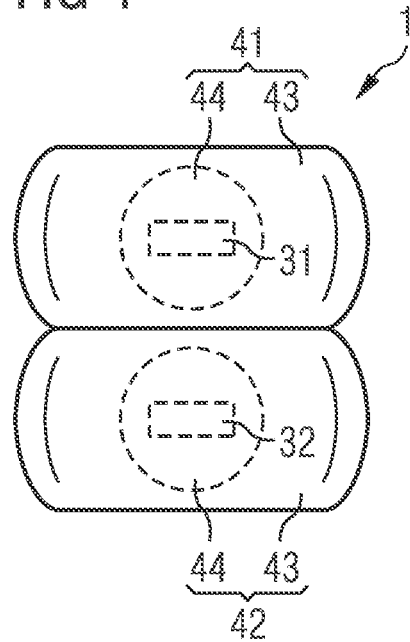
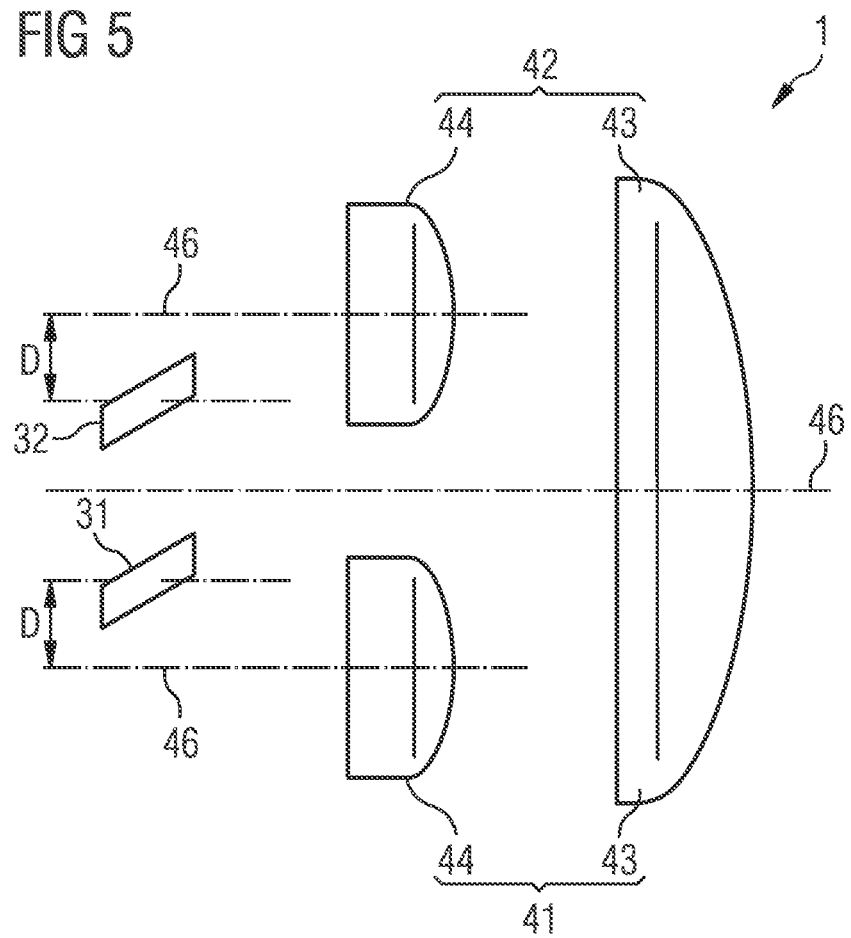

HEADLIGHT AND OPERATING METHOD

CROSS REFERENCE TO RELATED APPLICATION

This application is a National Stage of International Application No. PCT/EP2018/081594, filed on Nov. 16, 2018, which designates the United States and was published in Europe, and which claims priority to German Patent Application No. 10 2017 128 125.8, filed on Nov. 28, 2017, in the German Patent Office. Both of the aforementioned applications are hereby incorporated by reference in their entireties.

A headlamp is specified. In addition, an operating method for a headlamp is specified.

An object to be solved is to specify a headlamp that can be operated efficiently and that can provide high illuminance levels.

This object is solved, inter alia, by a headlamp having the characteristics of claim 1. Preferred further developments are the subject of the other claims.

In particular, the headlamp has a pixelated structure for pixel-fine illumination of an optical far field with digitally controllable, dimmable LEDs.

According to at least one embodiment, the headlamp comprises a first semiconductor chip. Furthermore, the headlamp contains a second semiconductor chip. Preferably, there is exactly one first semiconductor chip and exactly one second semiconductor chip.

According to at least one embodiment, the first and the second semiconductor chip are each designed to generate light, in particular visible light. The first and the second semiconductor chips are preferably light emitting diode chips, in short LED chips.

According to at least one embodiment, the first semiconductor chip and the second semiconductor chip are each divided into several pixels. The pixels can be controlled electrically independently of each other. This allows the pixels to generate light independently of each other. Preferably, all pixels within the first as well as within the second semiconductor chip are identical in construction. Within the pixels there is preferably no further subdivision. This means that the pixels then represent the smallest electro-optical unit of the semiconductor chips.

According to at least one embodiment, the headlamp comprises a first optics. The first optics is optically downstream of the first semiconductor chip. Via the first optics, light from the first semiconductor chip is directed into a base region with a first magnification. The base region is rectangular, for example.

According to at least one embodiment, the headlamp contains a second optics which directs light from the second semiconductor chip with a second magnification into a bright region. The bright region is also rectangular, for example.

According to at least one embodiment, the second magnification is at least 0.3 times or 0.4 times and/or at most 0.7 times or 0.6 times the magnification of the first optics. In particular, the second magnification is 0.5 times the first magnification.

According to at least one embodiment, the bright region is smaller than the base region. Preferably, a size of the bright region is at least 10% or 15% or 20% and/or at most 60% or 50% or 35% of the base region. In particular, the base region is four times larger than the bright region.

According to at least one embodiment, the bright region is partially, predominantly or completely within the base region. Predominantly means preferably at least 50% or 75% or 90%. In particular, the bright region is surrounded all around by a continuous, uninterrupted path of the base region.

According to at least one embodiment, the bright region and the base region have the same basic geometric shape, for example a rectangular basic shape. The basic shape of the light area is preferably oriented in the same way as the basic shape of the base region. This means that there is no twist between the two basic shapes. For example, long sides of the rectangles that form the basic shapes are oriented parallel to each other.

The headlamp is intended for a motor vehicle such as a car. The headlamp may be a car headlamp.

In at least one embodiment, the headlamp comprises a first semiconductor chip for generating light and a second semiconductor chip also for generating light. The first semiconductor chip and the second semiconductor chip each comprise several pixels. A first optics is configured to direct light from the first semiconductor chip with a first magnification into a base region. A second optics directs light from the second semiconductor chip with a second magnification into a bright region. The second magnification is between 0.3 times and 0.7 times, preferably between 0.4 times and 0.6 times, the first magnification, so that the bright region is smaller than the base region. The bright region is at least predominantly within the base region.

In the headlamp described here, an illumination of an optical far field, also known as the field of view or FoV for short, is achieved by two hybrid integrated LED array chips, also known as μAFS, where AFS stands for adaptive headlamp. The semiconductor chips each have an aspect ratio that preferably corresponds approximately to that of the required illumination range, e.g. 40° horizontally to 10° vertically with an aspect ratio of the semiconductor chips of approximately 4:1. The illumination range corresponds in particular to the bright region. Here, two identical semiconductor chips with different magnifications are preferably imaged into the optical far field.

One of the semiconductor chips, in particular the first semiconductor chip, illuminates the entire FoV, the second semiconductor chip is preferably imaged with half the magnification in vertical and horizontal direction into the FoV. The bright region, as generated by the second semiconductor chip, is preferably aligned horizontally in the middle or slightly off-center to the bright region. Vertically, the bright region is preferably predominantly or completely in front of a vertical 0° line and is accordingly imaged downwards in order to illuminate essentially the pre-field and the cut-off line of the headlamp. The approximately half magnification for the second semiconductor chip essentially doubles the pixel resolution in vertical and horizontal direction and doubles the intensity accordingly.

For example, the first semiconductor chip, which is imaged over the full angular range of the base region, achieves an angular resolution of 0.1°. The second semiconductor chip, which is imaged on a smaller scale, preferably achieves an angular resolution of approximately 0.05°.

Due to the interaction of the two semiconductor chips, the central bright region can be illuminated brighter than the background, corresponding to the base region. Furthermore, the resolution in the bright region is higher than in the remaining, surrounding base region. This allows a more refined headlight range adjustment. In addition, a higher light intensity can be achieved in the bright region with the second semiconductor chip than with only one semiconductor chip for the headlamp. A chip area of the two semiconductor chips together can be smaller than a chip area of a single and correspondingly larger semiconductor chip, which enables complete illumination. This saving of chip area by splitting it into the two semiconductor chips makes it possible to reduce costs. With pixel sizes around 40 μm to 30 μm, a high angular resolution of approximately 1/20° in the central bright region can be achieved, with an intensity of the light directly at the semiconductor chips in the range of 150 lm/mm2 the up to 400 lm/mm2.

According to at least one embodiment, the first semiconductor chip and the second semiconductor chip are identical in construction. This means that identical semiconductor chips can be used within the manufacturing tolerances. This means that the semiconductor chips are the same size, produce light of the same spectral composition and have the same subdivision into pixels.

According to at least one embodiment, the first and second magnification scales are fixed. This means that the magnifications do not change when the headlamp is operated as intended. In other words, the first optics and the second optics may each be a fixed optical system, preferably free of moving parts. In particular, the distance between the semiconductor chips and the associated optics does not change when the headlamp is operated as intended.

According to at least one embodiment, the first optics and/or the second optics comprise several lenses. The lenses may be glass lenses. The lenses are designed, for example, as convex or biconvex convergent lenses, Fresnel lenses or microlens arrays. The optics and thus the lenses can have rotational symmetry or only an axis of symmetry, for example in the case of cylindrical lenses or lenses designed similar to cylindrical lenses. The lenses of the respective optics are preferably arranged along a light path in the direction away from the respective semiconductor chip.

According to at least one embodiment, the first optics and the second optics are independent of each other. This means in particular that the first and second optics do not share any optically effective components. This makes it possible that the first semiconductor chip together with the first optics can be handled independently of the second semiconductor chip together with the second optics.

It is possible that the first semiconductor chip together with the first optics forms a module that can be handled separately and that a further module is formed by the second semiconductor chip together with the second optics, optionally each together with a housing or part of a housing. These modules can preferably be mounted independently of one another and can be fitted and/or exchanged in a car or motor vehicle.

According to at least one embodiment, the first optics and the second optics touch each other in places. For example, there is one or more points of contact or one or more lines of contact or a plane of contact between the first optics and the second optics. The fact that the first and second optics are touching does not exclude the possibility that the optics are optically independent of each other.

According to at least one embodiment, the first optics and the second optics are only partially independent of each other. This means, for example, that the first and second optics have at least one common component. The common component is, for example, an output lens from which the light produced is emitted by the headlamp. It is possible that such an output lens is the only common optically active component of the first and second optics.

According to at least one embodiment, the first optical unit and the second optical unit each have their own light input lens. This means that the light input lenses can be selected independently of each other. If there are light input lenses, there may be further lenses of the respective optics between the common output lens, for example, and the respective associated light input lens.

According to at least one embodiment, the first semiconductor chip and/or the second semiconductor chip are arranged eccentrically to the associated light-incoming lens and/or to the associated output lens. The eccentric arrangement of the semiconductor chips relative to the light input lens can compensate for an eccentric arrangement relative to the output lens. This applies in particular in the case of a common output lens for the first and second semiconductor chips.

According to at least one embodiment, the first semiconductor chip and the second semiconductor chip are arranged on a common carrier, in particular next to each other. The carrier may be a heat sink and/or a printed circuit board. For example, the carrier is a heat sink, a ceramic plate, a metal core board or a printed circuit board, PCB for short. Preferably, the carrier has conductor paths for connecting the semiconductor chips.

The carrier can consist of a heat sink with mounted PCB or metal core PCB.

According to at least one embodiment, a distance between the first and second semiconductor chip is at least half or a whole diagonal length of the first semiconductor chip. Alternatively or additionally, this distance is at most 6 or 4 or 3 diagonal lengths of the first semiconductor chip.

According to at least one embodiment, a horizontal aperture angle of the base region in the far field is at least 25° or 30°, for instance starting from a light-emitting surface of the headlamp. Alternatively or additionally, this angle of aperture is at most 55° or 60°. The preferred horizontal aperture angle for the base region is about 35°.

According to at least one embodiment, a vertical aperture angle of the base region is at least 3° or 5°. Alternatively or additionally, the vertical aperture angle is at most 20° or 15° or 13°. In particular, the vertical aperture angle is approximately 10°.

According to at least one embodiment, a far field angle resolution per pixel of the first semiconductor chip for the base region is at least 0.03° or 0.06°. Alternatively or additionally, this angular resolution is at most 0.4° or 0.2° or 0.15°. The angular resolution may be the same in the vertical and horizontal directions and is, for example, approximately 0.1°.

According to at least one embodiment, a far-field angular resolution per pixel of the second semiconductor chip for the bright region exceeds the angular resolution per pixel of the first semiconductor chip for the base region by at least a factor of 1.5 or 1.8 or 2. Exceeding means in this context that the angular resolution is better by the factor mentioned, i.e. that there is a more accurate raster for the angular region. For example, the angular resolution of the second semiconductor chip for the bright region is at least 0.025° and/or at most 0.125°, especially around 0.05°.

According to at least one embodiment, the bright region is oriented left-right laterally symmetrically to a main viewing direction. The main viewing direction may correspond to a straight line of sight of a motor vehicle in which the headlamp is installed.

According to at least one embodiment, the base region is oriented asymmetrically and/or eccentrically to the main viewing direction in the left-right direction. Asymmetrical may mean that the base region is not rectangular in shape. By designing the base region asymmetrically and/or eccentrically, a more targeted illumination of a roadway area is possible. Asymmetry can be achieved, for example, by tilting the first semiconductor chip relative to the second semiconductor chip. Preferably, however, the first and second semiconductor chips are oriented equally to each other and have parallel longitudinal sides.

According to at least one embodiment, the first and second semiconductor chips each have at least 30×80 pixels or 50×150 pixels. Alternatively or additionally, the pixelation of the first and second semiconductor chips is at most 500×1500 or 320×1050.

According to at least one embodiment, an aspect ratio of the first and second semiconductor chips, seen in plan view, is at least 2 or 3. Alternatively or additionally, the aspect ratio is at most 8 or 5 or 4. The aspect ratio is a ratio of a long side to a short side of the semiconductor chips, seen in plan view.

According to at least one embodiment, the pixels of the first and/or second semiconductor chip each have a size of at least 10 µm×10 µm or 20 µm×20 µm when seen in plan view. Alternatively or additionally, this size is at most 0.2 mm×0.2 mm or 0.1 mm×0.1 mm or 60 µm×60 µm. All pixels are preferably identical in construction. The pixels can have, for instance, a square or rectangular ground plan when viewed from above.

According to at least one embodiment, the first and/or second semiconductor chip emits a luminous flux of at least 150 lm/mm2 or 200 lm/mm2 or 250 lm/mm2 on one emission side during operation as intended. Alternatively or additionally, the luminous flux at the emission side is at most 500 lm/mm2 or 400 lm/mm2. The above values apply in particular during stationary operation of the headlamp and may therefore be exceeded or underrun for a warm-up phase.

According to at least one embodiment, the headlamp is configured to produce an illuminance of at least 30 lx or 50 lx at a distance of 25 m in the base region. In the bright region, an illuminance of at least 150 lx or 250 lx is preferably achieved if both the first and the second semiconductor chip illuminate the region concerned.

According to at least one embodiment, the first and/or the second semiconductor chip each have a semiconductor layer sequence. The semiconductor layer sequence has an active zone for generating the respective light via electroluminescence.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also such as an arsenide compound semiconductor material such as $Al_nIn_{1-n-m}Ga_mAs$ or such as $Al_nGa_mIn_{1-n-m}As_kP_{1-k}$, where $0 \le n \le 1$, $0 \le m \le 1$ and $n+m \le 1$ and $0 \le k < 1$ apply respectively. Preferably for at least one layer or for all layers of the semiconductor layer sequence $0 < n \le 0.8$, $0.4 \le m < 1$ and $n+m \le 0.95$ as well as $0 < k \le 0.5$ hold. The semiconductor layer sequence may contain dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

Preferably the semiconductor chips are based on the material system AlInGaN and emit blue light, alternatively near-ultraviolet radiation with a wavelength of maximum intensity of preferably at least 360 nm or 385 nm and/or of at most 420 nm or 410 nm.

According to at least one embodiment, the first and/or second semiconductor chip each comprise one or more phosphors. A partial or full conversion of the light generated in the semiconductor layer sequence itself is operated via the at least one phosphor. In particular, a partial conversion takes place so that blue light from the semiconductor chips mixes with approximately yellow light from the phosphor, so that white mixed light is emitted in total.

The at least one phosphor is preferably selected from the following group: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnet of the general system $(Gd,Lu,Tb,Y)_3(Al,Ga,D)_5(O,X)_{12}:RE$ where X=halide, N or divalent element, D=trivalent or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$; Eu2+-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ with RE=rare earth metals; nitrido-orthosilicates like $AE_{2-x-a}RE_xEu_aSiO_{4-x}N_x$ or $AE_{2-x-a}RE_xEu_aSi_{1-y}O_{4-x-2y}N_x$ where RE=rare earth metal and AE=alkaline earth metal or such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$. In addition, so-called quantum dots can also be introduced as converter material. Quantum dots in the form of nanocrystalline materials containing a group II-VI compound and/or a group III-V compound and/or a group IV-VI compound and/or metal nanocrystals are preferred. Furthermore, the phosphor may have a quantum well structure and be epitaxially grown.

According to at least one embodiment, the phosphor is pixelated in the same way as the associated first and/or second semiconductor chip. Thus optical crosstalk within the phosphor can be avoided. Alternatively, the phosphor can extend continuously over some or all of the pixels of the associated semiconductor chip.

According to at least one embodiment, optical isolation is present between adjacent pixels of the first semiconductor chip and/or the second semiconductor chip and/or the respective phosphor. The optical isolation is opaque or nearly opaque to visible light. The optical isolation can be formed by a specularly reflective material such as a metal layer, or by a diffusely reflective component such as a white-appearing encapsulant, or alternatively by an absorbing, for example black component.

According to at least one embodiment, the semiconductor layer sequence extends continuously over several or all pixels of the respective semiconductor chip. It is possible that the active zone also extends continuously over several or all of the semiconductor chips. Preferably, however, the active zone is also subdivided into the pixels.

Alternatively, it is possible that the semiconductor layer sequence between adjacent pixels is completely removed. In this case, all pixels preferably have the same semiconductor layer sequence, for example recognizable by the thicknesses of the individual sub-layers and the exact sequence of the sub-layers within the semiconductor layer sequence. The sub-layers provide a kind of fingerprint that can be used to identify whether the pixels are actually based on the same semiconductor layer sequence.

If the semiconductor layer sequence is singulated to the pixels, it is preferable that a relative position of the pixels to each other is not changed. This allows for particularly small distances between the pixels. A gap between adjacent pixels is therefore preferably at least 0.3 µm or 1 µm and/or at most 20 µm or 10 µm or 5 µm. The gaps between the pixels can be created by photolithography and thus be made particularly small.

According to at least one embodiment, the first and second semiconductor chips emit white light. Alternatively or additionally, the color loci of the light generated in the CIE-xy standard chromaticity diagram differ from each other by a maximum of 0.04 units or 0.01 units or 0.003 units. This means that the color loci of the light generated by the two semiconductor chips do not differ or do not differ significantly from each other for an observer. Preferably the color loci are fixed and not adjustable. This means that, as intended, the headlamp emits light of a specific, unchangeable color, especially white light.

In addition, an operating method is specified for a headlamp. The headlamp is designed as described in connection with one or more of the above-mentioned embodiments. Characteristics of the operating method are therefore also disclosed for the headlamp and vice versa.

In at least embodiment of the operating method, the first and second semiconductor chips are operated permanently or temporarily in such a way that only some of the associated pixels produce light. This enables targeted illumination of a driving area.

According to at least one embodiment, the first and second semiconductor chips are operated temporarily or permanently in such a way that light intensities from the first and second semiconductor chips add up at at least one point in the bright region. This means that these points are illuminated simultaneously by the first and second semiconductor chips to achieve high brightness.

According to at least one embodiment of the method, only the first semiconductor chip and, at times, only the second semiconductor chip are operated. It is possible that the entire bright region and the entire dark region are detected with an image recording device. The image recording device can be an external device or a device integrated in the motor vehicle in which the headlamp is installed. For example, a camera installed in the motor vehicle for driver assistance or for self-driving purposes can serve as an image recording device.

According to at least one embodiment, electronic adjustment of the bright region to the base region or vice versa is carried out. The adjustment is preferably carried out by means of software based on the data of the image recording device from the bright region and the base region. An adjustment result is stored in a control unit of the headlamp or the vehicle. This eliminates the need for complex mechanical fine adjustment, since the light range and the base region can be electronically matched to each other via the camera adjustment.

The control unit can be part of the semiconductor chips and/or part of the carrier on which the semiconductor chips are mounted. For this purpose, the semiconductor layer sequence of the semiconductor chips can each be applied to a functionalized substrate, for example a silicon substrate with integrated circuits, for example in CMOS technology.

In the following, a headlamp described here and an operating method described here are explained in more detail with reference to the drawing using exemplary embodiments. Like reference signs indicate like elements in the individual figures. However, no scale references are shown here; instead, individual elements may be shown in exaggerated size for better understanding.

Figure 1B:
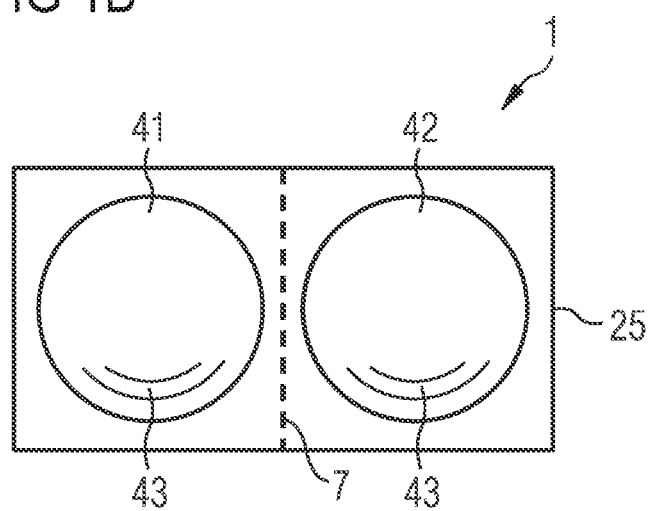
Figure 2:
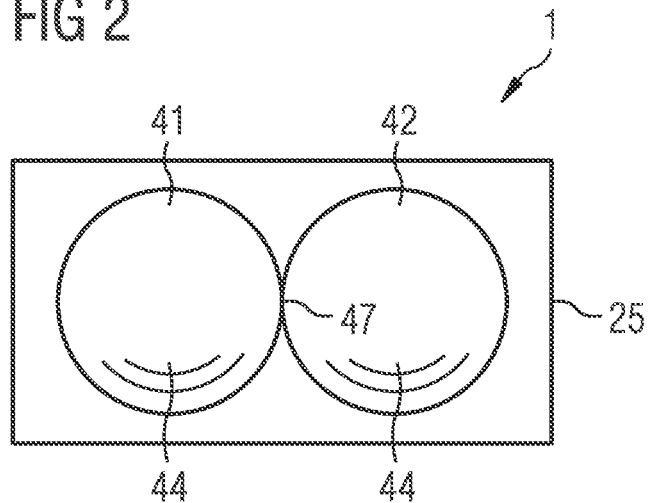
Figure 3A:
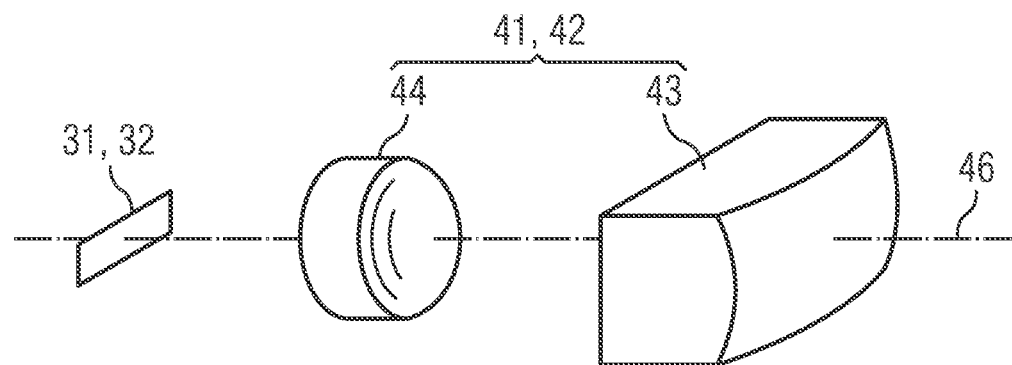
Figure 3B:
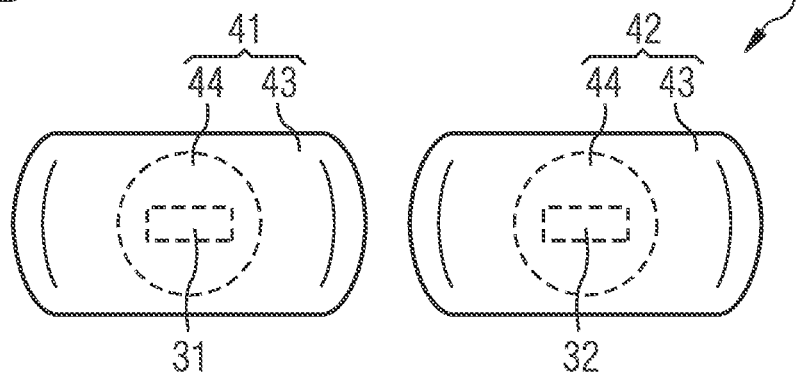
Figure 6:
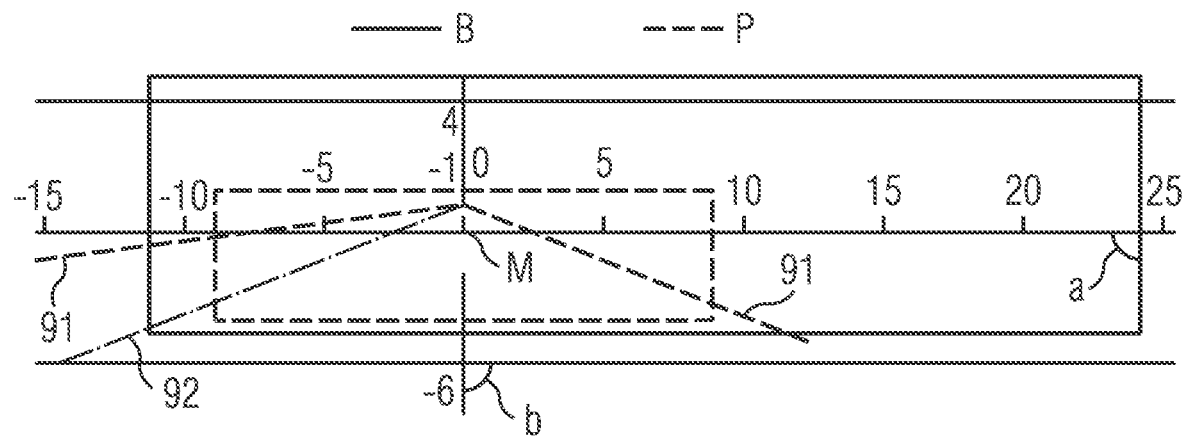
Figure 7:
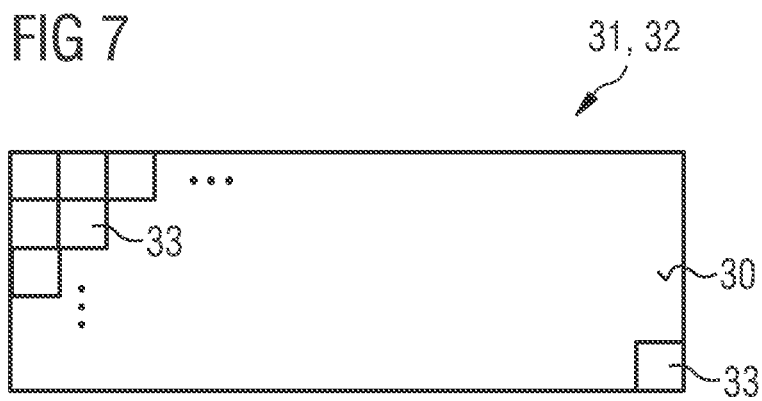
Figure 8:
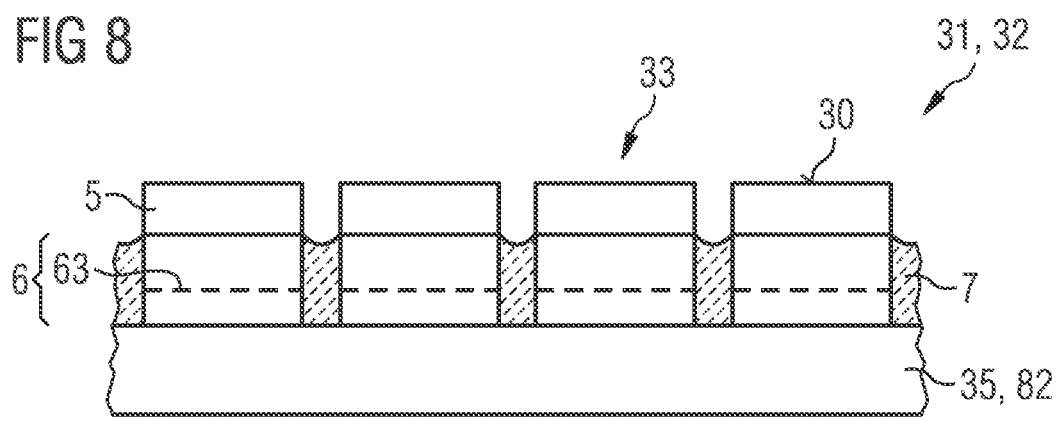
Figure 9:
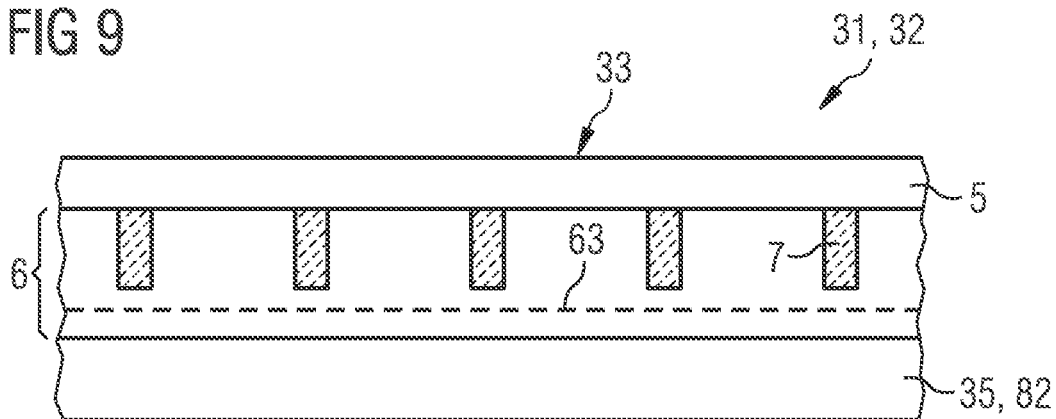
Figure 10:
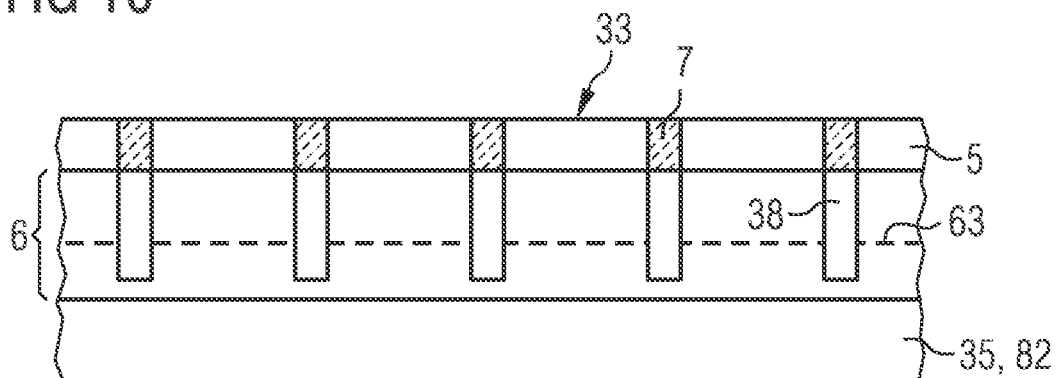
Figure 11:
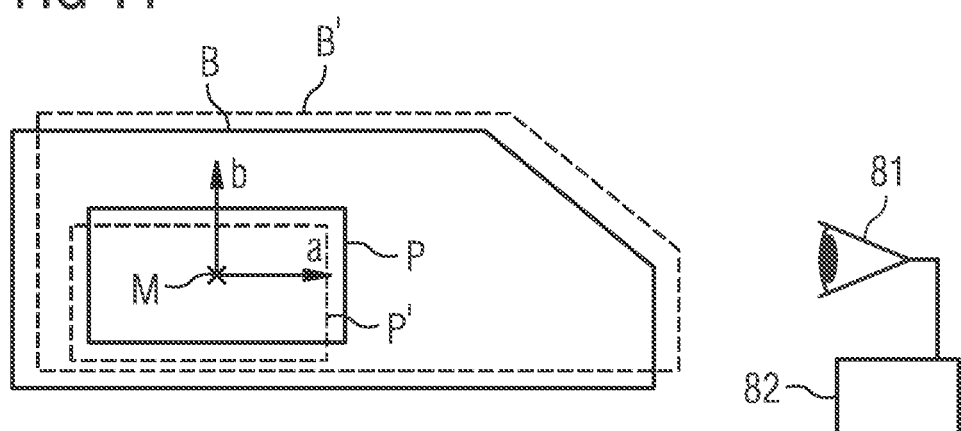

In the Figures:

FIG. 1A shows a schematic sectional view of an exemplary embodiment of a headlamp described here, FIG. 1B is a schematic plan view of the headlamp of FIG. 1A, FIG. 2 shows a schematic top view of an exemplary embodiment of a headlamp described here, FIG. 3A shows a schematic perspective view of an exemplary embodiment of a headlamp described here, FIG. 3B is a schematic plan view of the headlamp of FIG. 3A, FIG. 4 shows a schematic top view of an exemplary embodiment of a headlamp described here, FIG. 5 shows a schematic perspective sectional view of an exemplary embodiment of a headlamp described here, FIG. 6 shows a schematic diagram of an exemplary embodiment of a bright region and a base region of a headlamp described here, FIG. 7 shows a schematic top view of an exemplary embodiment for semiconductor chips for the headlamps described here, FIGS. 8 to 10 show schematic sectional views of exemplary embodiments of semiconductor chips for headlamps described here, and FIG. 11 shows a schematic diagram of an operating method for adjusting a headlamp described here.

In FIG. 1 an example of a headlamp 1, for example for a car is illustrated. The headlamp 1 comprises a carrier 2 on which a first pixelated semiconductor chip 31 and a second pixelated semiconductor chip 32 are mounted. Optionally, a control unit 82 for the semiconductor chips 31, 32 is located in the carrier 2 or in the semiconductor chips 31, 32 themselves.

The semiconductor chips 31, 32 are assigned a first optics 41 and a second optics 42. The optics 41, 42 have different magnifications. Preferably, the magnifications differ by a factor of about 2. The optics 41, 42 each have a light input lens 44 close to the semiconductor chips 31, 32 and an output lens 43. The semiconductor chips 31, 32 and the corresponding lenses 43, 44 can be arranged centrally along optical axes 46, see FIG. 1A.

Optionally, a housing 25 is present which contains the optics 41, 42 and the semiconductor chips 31, 32. A connection between the output lenses 43 may also be realized by a part of the housing 25.

As an option, an optical isolation 7, for example an opaque partition wall, is located between the optics 41, 42 and the semiconductor chips 31, 32, for example as part of the housing 25. Such a partition wall also makes it possible that the semiconductor chips 31, 32 with the respective optics 41, 42 can be mounted as separately manageable modules on the carrier 2, for example by plugging or screwing them on.

The optics 41, 42 are independent of one another and are spaced apart from one another, especially when viewed from above, see FIG. 1B.

In the top view of FIG. 2, it is alternatively shown that the optics 41, 42 touch each other in a space-saving manner at only one point of contact 47. Nevertheless, the optics 41, 42 can be optically independent of each other.

In the exemplary embodiment of FIG. 3A, it is illustrated that the larger output lens 43 has a spherical light-emitting surface, but that the lens is cut to size and thus has an approximately rectangular cross-section when viewed in plan view, see FIG. 3B. The light input lenses 44 may be rotationally symmetrical in shape. By cutting the light input lenses 44 to size, a particularly space-saving arrangement can be achieved.

According to FIG. 3B, the optics 41, 42 are arranged linearly along longitudinal axes in plan view. On the other hand, the optics 41, 42 are arranged longitudinally as shown in FIG. 4. This means that the lenses 41, 42 can touch each other along a line or in a plane, in particular defined by the output lenses 43.

FIG. 5 illustrates that the lenses 41, 42 have a common output lens 43. The output lens 43 also constitutes a light-emitting surface of headlamp 1. In addition, each of the optics 41, 42 has its own light input lens 44. The semiconductor chips 31, 32 are oriented eccentrically to the optical axes 46 of the input lenses 44 and also eccentrically to the optical axis 46 of the common output lens 43. By a corresponding offset D relative to the optical axis of the light input lenses 44, an offset to the optical axis 46 of the common output lens 43 can be compensated, so that the semiconductor chips 31, 32 illuminate the same area at least in places. The light input lenses 44 have different focal lengths in order to achieve different magnifications.

As an alternative to the illustration in FIG. 5, it is possible that the semiconductor chips 31, 32 have different distances from the common output lens 43. This can be achieved, for example, by using a non-drawn stepped carrier or by designing a housing accordingly.

FIG. 6 illustrates an illumination pattern of headlamp 1 along a horizontal angle a and a vertical angle b. An intersection of the axes for angles a, b corresponds to a main viewing direction M of headlamp 1. The main viewing direction M may coincide with a straight line direction of travel of the vehicle in which the headlamp is installed. Road marker lines 91 and a centerline 92 of the road are also illustrated.

FIG. 6 illustrates that a comparatively large base region B is illuminated by the first semiconductor chip 31 and a comparatively small bright region P, also known as punch area, by the second semiconductor chip 32. The bright region P lies completely within the base region B and also centrally around the axis for the vertical angle b. Both areas B, P are aligned eccentrically to the axis for the horizontal angle a. The base region B is also eccentric to the axis for the vertical angle b.

In the horizontal direction a, for example, the bright region P ranges from just under −9° to just under +9° and the base region B from −12° to +23°. In the vertical direction, for example, the bright region P ranges from −4.0° to +1.0° and is thus predominantly below the axis for the horizontal angle a. The base region B ranges from −5° to +5° along the angle b.

An angular resolution due to the pixelation of the first semiconductor chip 31 for the base region B is approximately 0.125° in the vertical and horizontal directions. This corresponds to a spatial resolution of 5.5 cm at a distance of 25 m. Using the first semiconductor chip 31, an illuminance of 54 lx is achieved at a distance of 25 m. Via the second semiconductor chip 32 with the smaller magnification, an angular resolution of 0.0625° is achieved, corresponding to a spatial resolution of 2.7 cm at a distance of 25 m. An illuminance due to the second semiconductor chip 32 alone, for example, is 217 lx, so that in the bright region P, when both semiconductor chips 31, 32 are operated, an illuminance of approximately 270 lx can be achieved.

FIG. 7 illustrates that the semiconductor chips 31, 32 are subdivided into a large number of pixels 33, preferably in a square grid. The pixels 33 are square when viewed from above with an edge length of, for example, 40 µm. An aspect ratio of the semiconductor chips 31, 32 is approximately 3.5:1, for example with a length of 11.2 mm and a width of 3.2 mm, corresponding to an area of 35.8 mm². The semiconductor chips 31, 32, for example, have 80×280 pixels.

FIG. 8 illustrates that the semiconductor chips 31, 32 each have a semiconductor layer sequence 6 with an active zone 63 for light generation. The semiconductor layer sequence 6, for example, is based on the material system InGaN. The semiconductor layer sequence 6 is completely removed between adjacent pixels 33, whereby a distance between the pixels 33 is only very small and is in the order of 1 µm. The semiconductor layer sequence 6 is detached from a growth substrate and applied to a replacement substrate 35, for example a silicon substrate, in which the control unit 82 can be partially or completely integrated. When the growth substrate is detached and applied to the replacement substrate 35, a distance between adjacent pixels 33 preferably does not change.

Furthermore, a phosphor 5 is optionally available, which can be mounted on the growth substrate with pixel accuracy and also subdivided into the pixels 33. Together with radiation from the active zone 33, the phosphor 5 is used to generate preferably white mixed light.

Optical isolation 7 is available as an option. This is formed, for example, by encapsulating silicone with titanium dioxide scattering particles. Optical isolation 7 can also fill in the gaps between the individual areas of phosphor 5, in contrast to the illustration in FIG. 8.

In the exemplary embodiment in FIG. 9, the semiconductor layer sequence 6 extends continuously over all pixels 33. This can also apply to phosphor 5. It is possible that the active zone 63 also extends continuously over all pixels 33. Areas between adjacent pixels 33 may be completely or partially filled by the optical isolation 7.

An electrically independent control of the pixels 33 from each other is achieved by the fact that an electrical cross conductivity of the remaining semiconductor layer sequence 6 is only low and/or can be neglected.

According to FIG. 10, the semiconductor layer sequence 6 between the pixels 33 is partially removed, wherein the active zone 63 is removed as well. Between adjacent pixels 33, cavities 38 can form in the area of the semiconductor layer sequence 6, which are evacuated or filled with a gas, for example. According to FIG. 10, the optical isolation 5 extends only between areas of the pixelized phosphor 5, but can optionally extend into the cavities 38.

The configurations shown in FIGS. 8 to 10 for the semiconductor layer sequence 6, the subdivision into pixels 33, the pixelation of the phosphor 5 and for the optical isolation 7 can be combined with each other and be present in all exemplary embodiments accordingly.

FIG. 11 illustrates an adjustment of the areas B, P to each other. First, illumination is performed using the initial bright region P', detected by an image recording device 81 like a camera. Using the data from the camera 81, the emission of the associated semiconductor chip is electronically adjusted to the desired bright region P by setting a specific pixel 33 as the zero point and/or defining a specific pixel sequence as the horizontal line. The same is electronically corrected from an initial base region B' to a base region B. Calibration data can be stored in the control unit 82.

This allows an electronic or electro-optical fine adjustment to be carried out without the semiconductor chips 31, 32 with the associated optics 41, 42 having to be additionally mechanically adjusted.

The invention described here is not limited by the description using the exemplary embodiments. Rather, the invention encompasses every new feature as well as every combination of features, which in particular includes every combination of features in the claims, even if this feature or this combination itself is not explicitly stated in the claims or exemplary embodiments.

LIST OF REFERENCE SIGNS 1 headlight
2 carrier
25 housing
30 emission side of the semiconductor chips
31 first pixelated semiconductor chip
32 second pixelated semiconductor chip
33 pixel
35 substrate
38 cavity
41 first optics
42 second optics
43 output lens
44 light input lens
46 optical axis
47 point of contact
5 phosphor
6 semiconductor layer sequence
63 active zone
7 optical isolation
81 image recording device
82 control unit
91 street boundary
92 centerline
a angle horizontal
b angle vertical
B base region
D offset
M main viewing direction
P bright region

The invention claimed is:

1. A headlamp with
a first semiconductor chip for generating light having a plurality of pixels,
a second semiconductor chip for generating light having a plurality of pixels,
a first optics which directs light of the first semiconductor chip with a first magnification into a base region, and
a second optics which directs light of the second semiconductor chip into a bright region with a second magnification,
wherein
the second magnification is between 0.3 times and 0.7 times the first magnification inclusive, so that the bright region is smaller than the base region,
the bright region is at least predominantly within the base region,
said first and second semiconductor chips each comprise a semiconductor layer sequence having an active zone, and
the semiconductor layer sequence extends continuously over all pixels of the respective semiconductor chip.

2. The headlamp according to claim 1, in which the first semiconductor chip and the second semiconductor chip are identical in construction,
wherein the first and second magnifications are fixed and the bright region is completely within the base region.

3. The headlamp according to claim 1, in which the first optics and the second optics each comprise several lenses, wherein said first and second optics are independent of each other.

4. The headlamp according to claim 1, in which the first optics and the second optics touch each other in places.

5. The headlamp according to claim 1, in which the first optics and the second optics are only partially independent of one another and have at least one common component.

6. The headlamp according to claim 5, in which the first optics and the second optics have a common output lens at which the light generated exits the headlamp,
wherein the first and second optics each have a separate light input lens, and
wherein the first semiconductor chip and the second semiconductor chip are arranged eccentrically with respect to both the associated light input lens and the output lens.

7. The headlamp according to claim 1, in which the first semiconductor chip and the second semiconductor chip are arranged on a common carrier,
wherein a distance between the first and second semiconductor chips, as seen in plan view, is at least half a diagonal length and at most four diagonal lengths of the first semiconductor chip.

8. The headlamp according to claim 1, in which a horizontal opening angle of the base region is between 25° and 45° inclusive and a vertical opening angle of the base region is between 5° and 20° inclusive,
wherein an angular resolution per pixel of the first semiconductor chip for the base region is between 0.03° and 0.4° inclusive, and
wherein an angular resolution per pixel of the second semiconductor chip for the bright region exceeds the angular resolution per pixel of the first semiconductor chip by at least a factor of 1.5.

9. The headlamp according to claim 1, in which the bright region is oriented laterally symmetrically to a main viewing direction and the base region is oriented asymmetrically and/or eccentrically to the main viewing direction.

10. The headlamp according to claim 1, in which the first and second semiconductor chips each have between 30×80 and 320×1050 of the pixels inclusive,
wherein an aspect ratio of the first and second semiconductor chips is between 2 and 6, respectively.

11. The headlamp according to claim 1, in which the pixels of the first and second semiconductor chips each have a size between 10 μm×10 μm and 0.1 mm×0.1 mm inclusive when viewed from above, the first and the second semiconductor chip emitting a luminous flux of at least 200 lm/mm² on an emission side during operation as intended, and
wherein the headlamp is adapted to produce an illuminance of at least 30 lx in the base region and at least 150 lx in the bright region at a distance of 25 m.

12. The headlamp according to claim 1, in which the first and second semiconductor chips are each based on the AlInGaN material system and each comprise at least one phosphor,
wherein said phosphor is pixelated in the same manner as said first and second semiconductor chips, and
wherein an optical isolation is each provided between adjacent pixels.

13. The headlamp according to claim 1, in which the first and second semiconductor chips each emit white light and color loci of the respective generated light in the CIE-xy chromaticity diagram differ by not more than 0.05 units from each other,
where the color loci are fixed.

14. An operating method for a headlamp according to claim 1,
wherein the first and second semiconductor chips are operated at least temporarily so that only some of the associated pixels generate light at a time, the first and second semiconductor chips being operated at least temporarily in such a way that light intensities from the first and second semiconductor chips are superimposed at at least one point in the bright region.

15. The operating method according to claim 14,
wherein at times only the first semiconductor chip and at times only the second semiconductor chip is operated,
wherein the bright region produced thereby and the base region are detected by an image recording device, and
whereby subsequently an electronic adjustment of the bright region to the base region, or vice versa, takes place and an adjustment result is stored in a control unit of the headlamp, so that a mechanical fine adjustment is not necessary.

16. A headlamp with
a first semiconductor chip for generating light having a plurality of pixels,
a second semiconductor chip for generating light having a plurality of pixels,
a first optics which directs light of the first semiconductor chip with a first magnification into a base region, and
a second optics which directs light of the second semiconductor chip into a bright region with a second magnification,
wherein
the second magnification is between 0.3 times and 0.7 times the first magnification inclusive, so that the bright region is smaller than the base region,
the bright region is at least predominantly within the base region,
said first and second semiconductor chips each comprise a semiconductor layer sequence having an active zone,
the semiconductor layer sequence extends continuously over all pixels of the respective semiconductor chip
a horizontal opening angle of the base region is between 25° and 45° inclusive and a vertical opening angle of the base region is between 5° and 20° inclusive,
an angular resolution per pixel of the first semiconductor chip for the base region is between 0.03° and 0.4° inclusive, and
an angular resolution per pixel of the second semiconductor chip for the bright region exceeds the angular resolution per pixel of the first semiconductor chip by at least a factor of 1.5.

* * * * *